United States Patent
Lemmon et al.

(10) Patent No.: US 7,895,493 B2
(45) Date of Patent: Feb. 22, 2011

(54) BUS FAILURE MANAGEMENT METHOD AND SYSTEM

(75) Inventors: Wayne Lemmon, Blanding, UT (US); Zane Coy Shelley, Rochester, MN (US); Alwood Patrick Williams, III, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 298 days.

(21) Appl. No.: 12/110,611

(22) Filed: Apr. 28, 2008

(65) Prior Publication Data

US 2009/0271668 A1    Oct. 29, 2009

(51) Int. Cl.
*G01R 31/3181* (2006.01)
*G01R 31/40* (2006.01)

(52) U.S. Cl. .................................. 714/742; 714/712
(58) Field of Classification Search .................. None
See application file for complete search history.

(56) References Cited

U.S. PATENT DOCUMENTS

| | | | |
|---|---|---|---|
| 4,245,344 A * | 1/1981 | Richter ................... | 714/43 |
| 4,646,312 A * | 2/1987 | Goldsbury et al. ........ | 714/763 |
| 6,721,707 B1 * | 4/2004 | Chu et al. ................. | 704/500 |
| 7,027,418 B2 * | 4/2006 | Gan et al. ................. | 370/329 |
| 7,080,288 B2 | 7/2006 | Ferraiolo et al. | |
| 2007/0234114 A1 | 10/2007 | Bailey et al. | |
| 2008/0163007 A1 * | 7/2008 | Shaeffer et al. ............ | 714/52 |

\* cited by examiner

*Primary Examiner*—Jeffrey A Gaffin
*Assistant Examiner*—Dipakkumar Gandhi
(74) *Attorney, Agent, or Firm*—Douglas A. Scholer

(57) ABSTRACT

A method, apparatus and program product improve computer reliability by, in part, identifying a plurality of error occurrences from Error Correction Codes. It may then be determined if the plurality of error occurrences are associated with a single bit of a bus. The determined, single bit may correspond to a faulty component of the bus. This level of identification efficiently addresses problems. For instance, a corrective algorithm may be applied if the plurality of error occurrences are associated with the single bit. Alternatively, the bus may be disabled if the plurality of error occurrences are not associated with the single bit of the bus. In this manner, implementations may detect, identify and act in response to multiple failure modes.

20 Claims, 2 Drawing Sheets

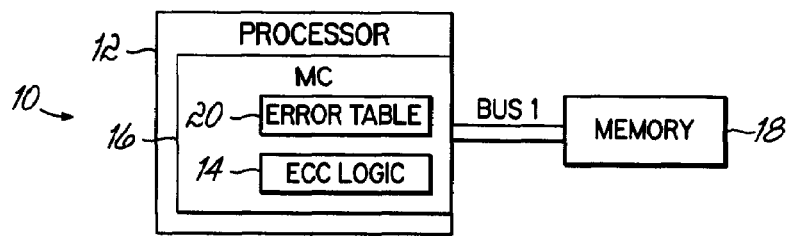
FIG. 1
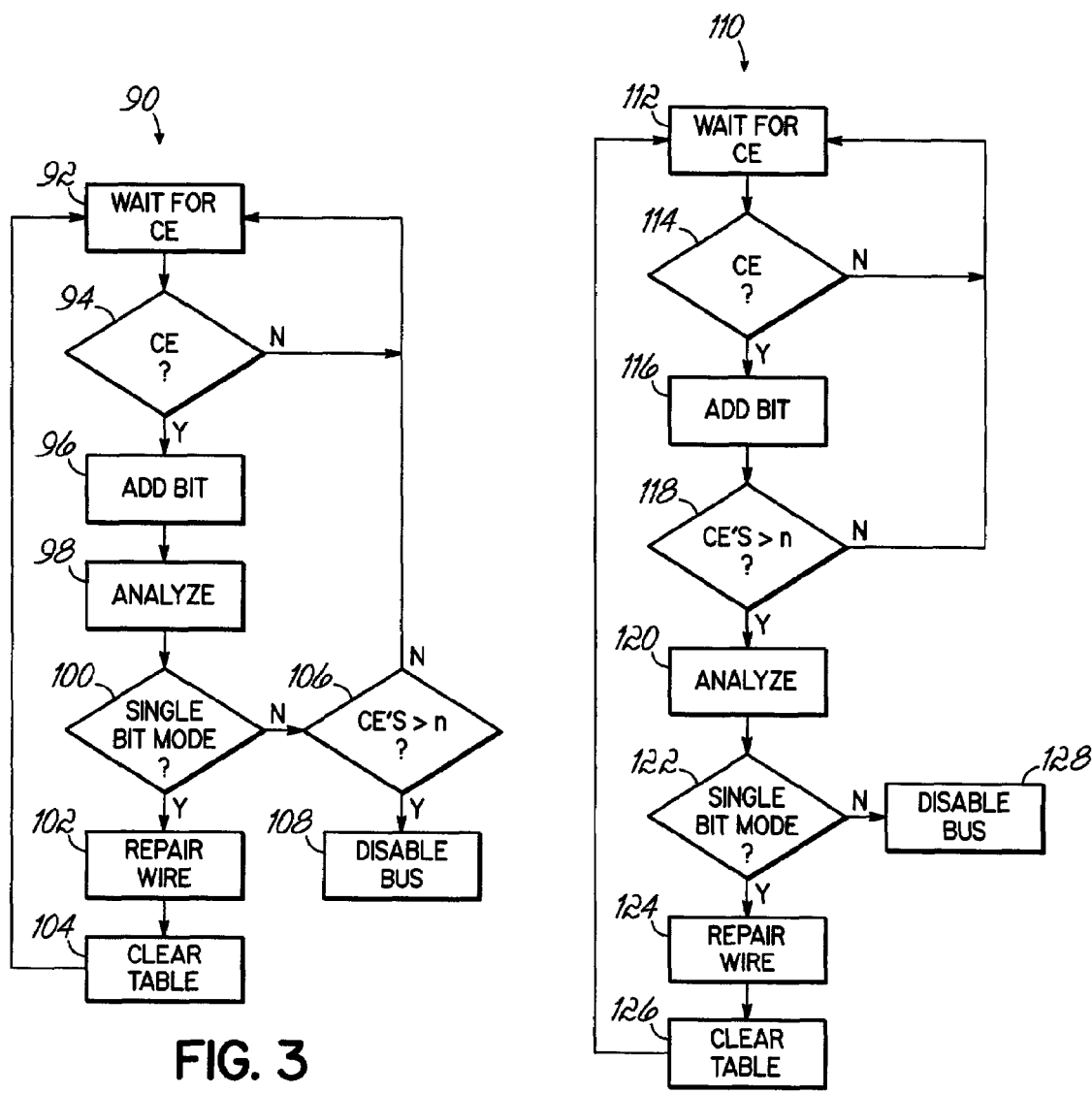
FIG. 3
FIG. 4

BUS FAILURE MANAGEMENT METHOD AND SYSTEM

FIELD OF THE INVENTION

The present invention relates generally to data processing, and more particularly, to fault detection practices in the transmission and storage of data.

BACKGROUND OF THE INVENTION

Error Correcting Codes assist in the reliable transmission and storage of data. Error Correcting Codes provide a mechanism by which data that has been distorted by noise or another disturbance can be recovered. Many hardware diagnostic tests for memory arrays rely on the hardware generated Error Correcting Codes to detect and correct single bit errors. Error Correcting Codes are often further enabled to detect, but not correct, multi-bit errors known as uncorrectable errors. The redundancy provided by Error Correcting Code practices is crucial for many applications where re-transmission of messages is impossible or costly.

The majority of the communication buses between subcomponents have Error Correcting Code protection built into the hardware in order to improve reliability. The Error Correcting Codes of the data are checked by the receiving piece of hardware on a bus, which is a wire or set of wires connecting more than two devices. If an error is detected, that error is recorded in the error register built into the hardware. Most of the time, this error information is reported to the service processor of the system using an interruption. A service processor typically comprises a peripheral card located in the server for performing various firmware functions. Software executing on the service processor may perform diagnostic and/or repair actions for an error.

As discussed herein, detection of a correctable error implies that the original data is recoverable based on the Error Correcting Code algorithm. Typically, when an error can be corrected, the Error Correcting Code algorithms allow for the detection of which part of the data was corrupted. This error location corresponds to a specific bit or group of bits, which may reflect a specific faulty wire or pin.

Many data and command buses have spare wires. When diagnostic firmware detects correctable errors frequently occurring on a specific wire, the diagnostic firmware may perform a self-heal operation to the hardware by reprogramming the hardware to use the spare wire instead of the faulty wire. Depending on the hardware support, this repair action can be done dynamically, without rebooting the server, or statically, during the machine's initial program load, or ILP.

An uncorrectable error means that the Error Correcting Code encoding has been damaged in transmission such that the original data cannot be discovered. In the event of an uncorrectable error, the Error Correcting Code algorithm does not allow for the identification of specific location failures because data has been lost. Therefore, the only action diagnostic firmware can perform is keeping the bus from being used until a service action can be completed.

There are many stages where a hardware failure can occur. From the point when the data is encoded with an Error Correcting Code, it passes through, at a minimum, transmitter logic, bus connectors or pins, bus wires and receiver logic. All of this occurs before the Error Correcting Code is checked and decoded. The failure modes of these stages can be categorized into two classes, or modes: single bit and full bus failure.

Single bit is the most common failure mode. This failure may occur when there is a loose or corroded connection, a degrading wire, or a malfunction in the transmission or receiver logic. In the event of a single bit failure, a repair action can be performed.

Full bus failures may occur if there is a high level of interference due to other nearby circuitry, or due to a weak transmitter or receiver. In the event of a full bus failure, it is unsafe to perform a repair action because there is a greatly increased likelihood of an uncorrectable error occurring, even if the bus is currently only experiencing correctable errors. In this instance, the bus must be disabled and routed around, if possible.

Current solutions do not attempt to identify between these error modes, but instead perform the single bit type repair action anytime there is a problem. After the repair action has been performed, another error must occur before completely removing the bus from operation. This leaves the machine at more risk for uncorrectable errors to occur until the bus has been removed.

Therefore, to facilitate improved system reliability, there exists a need to identify and distinguish between single bit and full bus failure modes in order to perform the different actions it takes to correct them.

SUMMARY OF THE INVENTION

The present invention provides an improved computer implemented method, apparatus and program product for managing errors in a bus operation by in part, identifying a plurality of error occurrences from Error Correction Codes associated with transmitted data, and determining if the plurality of error occurrences are associated with a single bit of the bus. The determined single bit may correspond to a faulty component of the bus. This level of identification allows embodiments to address a problem more efficiently than prior art systems.

More particularly, aspects of the invention may apply a corrective algorithm if the plurality of error occurrences are associated with the single bit of the bus. Alternatively, embodiments consistent with the invention may disable the bus if the plurality of error occurrences are not associated with the single bit of the bus.

According to another aspect of the invention, embodiments may store information associated with the plurality of error occurrences. This storage may be cleared after a determination regarding the fault has been made. Embodiments may identify a predetermined number of error occurrences, and may be configured to determine that a correctable error is associated with the transmitted data. The transmitted data may be retrieved from a memory or received from a transmitting component.

Embodiments consistent with the invention may perform a statistical analysis and/or simple probability metric to information associated with the plurality of error occurrences.

These and other advantages and features that characterize the invention are set forth in the claims annexed hereto and forming a further part hereof. However, for a better understanding of the invention, and of the advantages and objectives attained through its use, reference should be made to the Drawings and to the accompanying descriptive matter in which there are described exemplary embodiments of the invention.

BRIEF DESCRIPTION OF THE DRAWINGS

FIG. 1 is a high level block diagram illustrating a memory system adapted for implementing failure mode detection in accordance with the present invention.

FIG. 3 is a flowchart having steps executable by the systems of FIGS. 1 and 2 for differentiating between single bit and full bus failure modes in a relatively direct manner that accounts for multiple detected, correctable errors in accordance with the present invention.

FIG. 4 is a flowchart having steps executable by the systems of FIGS. 1 and 2 for differentiating between single bit and full bus failure modes in a manner that accounts for multiple detected, correctable errors in accordance with the present invention.

DETAILED DESCRIPTION

Figure 2:
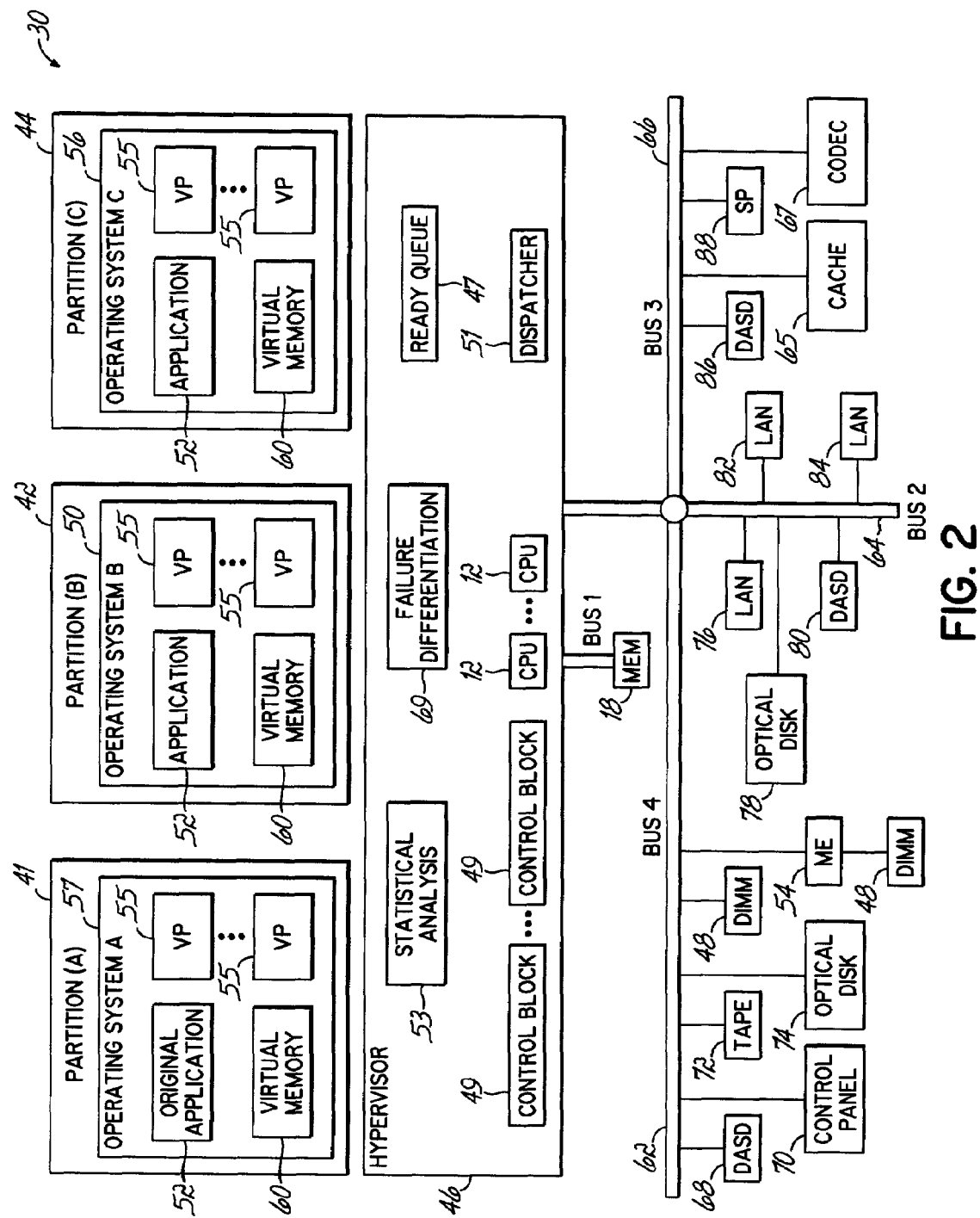
FIG. 2 shows primary software components and resources that may be used to implement a memory system such as that shown in FIG. 1 for detecting and correcting multi-bit errors within a logically partitioned environment.

Embodiments consistent with the invention may improve system reliability by, in part, identifying a plurality of error occurrences from Error Correction Codes. It may then be determined if the plurality of error occurrences are associated with a single bit of the bus. The determined, single bit may correspond to a faulty component of the bus. This level of identification allows embodiments to address a problem more efficiently than prior art systems. For instance, embodiments may apply a corrective algorithm if the plurality of error occurrences are associated with the single bit. Alternatively, embodiments consistent with the invention may disable the bus if the plurality of error occurrences are not associated with the single bit of the bus.

Put another way, aspects of the present invention improve system reliability by detecting, identifying and acting in response to multiple failure modes. In one sense, embodiments distinguish between single bit and full bus failure modes. Aspects may utilize correctable error analysis to efficiently categorize modes in a timely manner.

Embodiments consistent with the underlying principles of the present invention present multiple methodologies and associated hardware for differentiating between the two different failure modes. One aspect allows identification of the single bit type failure mode without needing to wait on numerous Error Correcting Code error occurrences. Another embodiment may include a relatively simple implementation that accumulates a relatively larger number of Error Correcting Code errors before performing any action. Preferred embodiments may incorporate statistical analysis for reliability. However, such statistical analysis may be substituted by a simple probability metric or other known analysis methodology.

Embodiments consistent with the invention may include storing correctable error information into a table. As such, the number of errors occurring on each wire, or pin, may be recorded. Based on this saved correctable error location information, statistical analysis may be accomplished to determine the certainty that a single bit failure mode has been identified. If the single bit failure mode cannot be identified with a specified confidence, embodiments consistent with the invention may assume that a bus failure event has occurred. This programmatic assumption may minimize the risk to the system otherwise present in the form of an uncorrectable error.

While many different analysis techniques may be used in a manner consistent with the underlying principles of the present invention, an exemplary statistical analysis model may include a typical confidence interval test on a binomial distribution. In a preferred embodiment, statistical analysis provides a Boolean answer as to whether a single bit failure mode has been identified.

Referring now to the Drawings, wherein like reference numerals may refer to like and corresponding parts throughout, FIG. 1 depicts a high level block diagram illustrating a memory system 10 adapted for implementing multi-bit error detection in accordance with the present invention. Memory system 10 generally comprises one or more memory devices, collectively represented in FIG. 1 as a memory block 18. As will be appreciated by one of skill in the art, the memory 18 may comprise multiple physical and logical memory devices.

The physical composition of the memory 18 may include one or more physical memory chips mounted within memory chip installation packages, such as dual inline memory modules (DIMMS), each comprising multiple random access memory (RAM) integrated circuits (ICs) or dynamic random access memory (DRAM). The constituent RAM ICs (not depicted) of memory 18 contain memory array structures comprising row and column structures. Memory lines within the array structure may be designated to contain data and address bits. The memory 18 may further be physically and logically divided and designated within a specified memory architecture that may include a hierarchical cache memory structure, as is familiar to those skilled in the art.

The memory 18 may couple to a processor 12 via a system bus (bus 1). Processor 12 may include and instruct a memory controller 16 to write and read data to and from memory 18. During hardware testing and operation, an Error Correcting Code logic module 14 within memory controller 16 may be utilized to test the operational status and reliability of memory 18. During a single pass, a specified pattern containing pattern and check bits may be written to and read from the various memory arrays within memory 18. The pattern may be used to determine the reliability of the one or more physical devices within memory 18, as described herein.

In one embodiment, the logic module 14 employs Hamming codes to detect and, in some cases, to undertake corrective action for errors detected within one or more of the devices within memory 18. The logic module 14 may function in both test and runtime capacities, where desired. In one example, control circuitry within the logic module 14 may use exclusive or ("XOR") logic functions to compute check bits, which in the case of Hamming codes, comprise parity bits from a read pattern of bits to detect errors. When used during system runtime operations, the logic module 14 may further include logic for correcting errors detected in the data before it is loaded into execution registers within processor 12. Such correctable errors may include those errors comprising a specified number of bits.

While the logic module 14 is depicted as incorporated within a processor mounted memory controller 16, it should be noted that alternate design configurations are possible without departing from the spirit or scope of the invention. For example, the logic module 14 may be implemented within Error Correcting Code logic contained on a dedicated application specific IC (ASIC) or one of the memory devices, such as within one or more DIMMs within memory 18.

FIG. 2 shows primary software components and resources used to implement a memory system 30 that detects multi-bit errors within a logically partitioned environment. FIG. 2 generally shows a computing architecture characterized as a virtual machine design, developed by International Business Machines Corp (IBM). The system 30 includes a plurality of partitions 41, 42, 44 that share common processing resources among multiple processes. Such an architecture may rely upon a single computing machine having one or more physical processors/CPUs 12. The CPUs 12 may execute software configured to simulate multiple virtual processors 55.

The partitions 41, 42, 44 may logically comprise a portion of a system's physical CPUs 12, DASD 68, and other resources as assigned by an administrator. Each partition 41, 42, 44 typically hosts an operating system 50, 56, 57 and may have multiple virtual processors 55. In this manner, each partition 41, 42, 44 operates largely as if it is a separate computer. As shown in FIG. 2, the production environment comprising each partition 41, 42, 44 may also include program code, such as the applications 52 shown in FIG. 2.

An underlying program called a hypervisor 46, or partition manager, may use this scheme to assign physical resources to each partition 41, 42, 44. In virtualization technology, the hypervisor 46 may manage the operating systems 50, 56, 57 (or multiple instances of the same operating system) on a single computer system. The hypervisor 46 may manage the system's processor, memory, and other resources to allocate what each operating system 50, 56, 57 requires. For instance, the hypervisor 46 may intercept requests for resources from operating systems 50, 56, 57 to globally share and allocate resources. If the partitions 41, 42 and 44 are sharing processors, the hypervisor 46 may allocate physical processor cycles between the virtual processors 55 of the partitions 41, 42, 44 sharing the CPU 12. In the context of multi-bit error detection, the hypervisor 46 may include statistical analysis program code 53 and failure differentiation program code 69, where desired. Thus, while embodiments of the invention are typically realized in firmware, aspects of the invention may additionally or alternatively be accomplished using software.

Each operating system 50, 56, 57 controls the primary operations of its respective logical partition 41, 42, 44 in the same manner as the operating system of a non-partitioned computer. Each logical partition 41, 42, 44 may execute in a separate memory space, represented by virtual memory 60. Moreover, each logical partition 41, 42, 44 is statically and/or dynamically allocated a portion of the available resources in system 30. For example, and as discussed herein, each logical partition may share one or more physical CPU 12, as well as a portion of the available memory space for use in virtual memory 60. In this manner, a given physical CPU 12 may be utilized by more than one logical partition 41, 42, 44.

The hypervisor 46 may include a dispatcher 51 that manages the dispatching of virtual processors to physical processors on a dispatch list or ready queue 47. The ready queue 47 comprises memory that includes a list of virtual processors having work that is waiting to be dispatched on a physical processor 12. Processor control blocks 49 of the hypervisor 46 comprise memory that includes a list of virtual processors waiting for access on a particular physical processor 12.

Additional resources, e.g., mass storage, backup storage, user input, network connections, and the like, are typically allocated to one or more logical partitions in a manner well known in the art. Resources can be allocated in a number of manners, e.g., on a bus-by-bus basis, or on a resource-by-resource basis, with multiple logical partitions sharing resources on the same bus. Some resources may even be allocated to multiple logical partitions at a time. FIG. 2 illustrates, for example, three logical buses, with a plurality of resources on bus 4, including a direct access storage device (DASD) 68, a control panel 70, a tape drive 72 and an optical disk drive 74, allocated to a partition. Bus 1 may include a memory 18 as discussed in the text describing FIG. 1. Bus 1 may further directly or indirectly couple the memory 18 to a CPU 12.

Bus 2 may have resources allocated on a resource-by-resource basis, e.g., with local area network (LAN) adaptor 76, optical disk drive 78 and DASD 80 allocated to logical partition 42, and LAN adaptors 82 and 84 allocated to logical partition 44. Bus 3 may represent, for example, a bus allocated specifically to logical partition 44, such that all resources on the bus, e.g., DASD 86 and service processor 88, may be allocated to the same logical partition. One skilled in the art will appreciate that other embodiments consistent with the invention may be realized by executing the above programs in an operating system 50, 56, 57 in addition or as opposed to in the hypervisor 46.

It will be appreciated that the illustration of specific resources in FIGS. 1 and 2 are merely exemplary in nature, and that any combination and arrangement of resources may be allocated to any logical partition in the alternative. For instance, it will be appreciated by one of skill in the art that in some implementations resources can be reallocated on a dynamic basis to service the needs of other logical partitions. Furthermore, it will be appreciated that resources may also be represented in terms of the I/O processors used to interface the computer with the specific hardware devices.

The various software components and resources illustrated in FIG. 2 may be implemented in a number of manners, including using various computer software applications, routines, components, programs, objects, modules, data structures, etc., referred to hereinafter as computer programs, tools, programs or program code. Program code typically comprises one or more instructions that are resident at various times in various memory and storage devices in the computer, and that, when read and executed by one or more processors in the computer, cause that computer to perform the steps necessary to execute steps or elements embodying the various aspects of the invention.

Moreover, while the invention has and hereinafter will be described in the context of fully functioning computers, those skilled in the art will appreciate that the various embodiments of the invention are capable of being distributed as a program product in a variety of forms, and that the invention applies equally regardless of the particular type of computer readable medium used to actually carry out the distribution. Examples of computer readable media include, but are not limited to tangible, recordable type media such as volatile and non-volatile memory devices, floppy and other removable disks, hard disk drives, magnetic tape, optical disks (e.g., CD-ROM's, DVD's, etc.), among others, and transmission type media such as digital and analog communication links.

In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

Those skilled in the art will recognize that the exemplary environments illustrated in FIGS. 1 and 2 are not intended to limit the present invention. Though not shown in FIG. 2, for instance, one skilled in the art will appreciate that other partitions may be included within other embodiments, including a partition that comprises part of the hypervisor 46. This hypervisor partition functions in many ways like the conventional partitions 41, 42 and 44 (and operating systems), but has no user interface for the customer to protect it from failures that might otherwise come about through user interaction. Furthermore, while three logical partitions 41, 42 and 44 are shown in FIG. 2, one skilled in the art will appreciate that more or fewer partitions may be implemented as needed. Other alternative hardware and/or software environments may thus be used without departing from the scope of the invention.

FIG. 3 shows a flowchart 90 having steps executable by the firmware on the service processor 88 of the system 30 of FIG. 2 for automatically differentiating failure modes. The flowchart 90, more particularly, shows a relatively direct manner of identifying between single bit and full bus failure modes.

Turning more particularly to the steps of the flowchart 90, the firmware of the system 30 may wait at block 92 for a correctable error to occur. Once a correctable error arrives at block 94, the firmware may automatically evaluate the Error Correcting Codes of the data to glean information identifying which bit(s) of the bus is improper. The bit may correspond to a faulty pin on the bus. The firmware may add this information identifying the bad bit to an error table 20.

At block 98 of FIG. 3, the system 30 may perform a statistical analysis. While many different analysis techniques may be used in a manner consistent with the underlying principles of the present invention, an exemplary statistical analysis model may include a typical confidence interval test based on a binomial distribution. In a preferred embodiment, statistical analysis provides a Boolean answer as to whether a single bit failure mode has been identified. That is, the analysis may determine whether a number or all of the detected errors is associated with a single bit, or faulty bus component.

Statistical analysis in one embodiment consistent with the invention may include comparing the number of correctable errors on the wire with the largest number of errors, to the total number of correctable errors detected. If, with an acceptable degree of confidence, enough correctable errors are noticed to be occurring on that one wire, then the system 30 may conclude that a single bit failure mode has occurred.

An exemplary confidence interval may be calculated by finding the mean and standard deviation of the binomial. As is known in the field of statistics, such a determination may include knowing the probability of an error on a bus in the full bus failure mode, which may be the inverse of the number of wires. The mean may include the number of correctable errors multiplied by the probability. Standard deviation may include the square root of the product of the number of correctable errors, multiplied by the probability, multiplied by the difference of one minus the probability. Should the number of errors on the worst wire be greater than the mean plus the product of n multiplied by the standard deviation, then the system 30 may identify that the single bit failure mode has been detected. The value of n may determine how confident or stringent of a test is desired. As discussed herein, any number of other analysis techniques capable of being applied to identify a single bit failure may be substituted in accordance with the underlying principles of the present invention.

As a result of the analysis, the system 30 may determine at block 100 that a single bit failure has occurred. As such, the system 30 may initiate processes at block 102 to repair the faulty wire, if applicable. The system 30 may also clear at block 104 the error table 20 to make ready for new detection analysis.

If the system 30 alternatively determines that there is not a single bit failure scenario at block 100, then the system 30 may determine at block 106 if the number of correctable errors is greater than some specified number, n. If so, then the system 30 may disable the bus at block 108. As such, the system 30 may also reroute around the disabled bus.

Alternatively, if the number of correctable errors is less than the specified number n at block 106, then the system 30 may cycle back to waiting at block 92 for a correctable error.

FIG. 4 is a flowchart 110 having steps executable by the systems of FIGS. 1 and/or 2 for differentiating between single bit and full bus failure modes in a manner that accounts for multiple detected, correctable errors in accordance with the present invention. This method may provide some large number probability that may correspond to the same number used in the statistical analysis.

Turning more particularly to the steps of the flowchart 110, the system 30 may wait at block 112 for a correctable error. Where a correctable error is detected at block 114, the system 30 may add a bit corresponding to a faulty pin to the error table 20 at block 116.

The system 30 may determine at block 118 if the number of correctable errors in the error table 20 is greater than some predetermined number n. If not, then the system 30 may return back to block 112 and wait for additional correctable errors.

Alternatively, if the number of correctable errors is larger than the number n at block 118, then the system 30 may perform at block 120 some statistical or other analysis.

Should the analysis determine at block 122 that a single bit error has occurred, the system 30 may initiate the application at block 124 of algorithms and other applicable processes to have the wire repaired. The system 30 may clear the error table 20 at block 126, and resume waiting for a correctable error at block 112.

Where the single bit failure has been determined at block 122 to have not occurred, the system 30 may initiate automated processes at block 128 towards disabling the bus.

While the present invention has been illustrated by a description of various embodiments and while these embodiments have been described in considerable detail, it is not the intention of the Applicants to restrict, or, in any way limit the scope of the appended claims to such detail. For example, while one preferred embodiment of the invention may execute at the service processor, alternative embodiments may alternatively implement aspects of the invention using the hypervisor, a Basic Input/Out System, or an operating system, among others. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. A method of managing an error in a bus operation, the method comprising:
   identifying a plurality of correctable errors associated with a bus comprising a plurality of wires using Error Correction Codes associated with transmitted data; and
   determining if the plurality of correctable errors are associated with a single bit of the bus by:
      determining that a wire of the plurality of wires is associated with a largest number of correctable errors of the plurality of wires; and
      comparing the largest number of correctable errors associated with the wire to a total number of correctable errors associated with the plurality of wires.

2. The method of claim 1 further comprising applying a corrective algorithm if the plurality of correctable errors are associated with the single bit of the bus.

3. The method of claim 1 further comprising disabling the bus if the plurality of correctable errors are not associated with the single bit of the bus.

4. The method of claim 1 further comprising storing information associated with the plurality of correctable errors.

5. The method of claim 1 further comprising, wherein identifying the plurality of correctable errors further comprises identifying a predetermined number of correctable errors.

6. The method of claim 1, wherein determining if the plurality of correctable errors are associated with a single bit further comprises performing at least one of a statistical analysis and a probability metric to information associated with the plurality of correctable errors.

7. The method of claim 1 further comprising clearing a memory storing information associated with the plurality of correctable errors.

8. The method of claim 1 further comprising determining the total number of correctable errors associated with the plurality of wires.

9. The method of claim 1 further comprising determining a number of correctable errors associated with each of the plurality of wires.

10. The method of claim 1, wherein the total number of correctable errors associated with the plurality of wires is one.

11. The method of claim 1, wherein the largest number of correctable errors associated with the wire is one.

12. An apparatus, comprising:
a memory;
program code resident in the memory; and
a processor in communication with the memory and configured to execute the program code to identify a plurality of correctable errors associated with a bus comprising a plurality of wires using Error Correction Codes associated with transmitted data, and to determine if the plurality of correctable errors are associated with a single bit of the bus by:
determining that a wire of the plurality of wires has a largest number of correctable errors of the plurality of wires; and
comparing the largest number of correctable errors associated with the wire to a total number of correctable errors associated with the plurality of wires.

13. The apparatus of claim 12, wherein the single bit corresponds to a faulty component of the bus.

14. The apparatus of claim 12, wherein the processor is further configured to apply a corrective algorithm if the plurality of correctable errors are associated with the single bit of the bus.

15. The apparatus of claim 12, wherein the processor is further configured to disable the bus if the plurality of correctable errors are not associated with the single bit of the bus.

16. The apparatus of claim 12, wherein the processor is further configured to initiate storage of information associated with the plurality of correctable errors.

17. The apparatus of claim 12, wherein the processor is further configured to identify a predetermined number of correctable errors.

18. The apparatus of claim 12, wherein the processor is further configured to perform at least one of a statistical analysis and a probability metric to information associated with the plurality of correctable errors.

19. The apparatus of claim 12, wherein the processor is further configured to clear a memory storing information associated with the plurality of correctable errors after the determination.

20. A program product, comprising:
program code configured to identify a plurality of correctable errors associated with a bus comprising a plurality of wires using Error Correction Codes, and to determine if the plurality of correctable errors are associated with a single bit of the bus by determining that a wire of the plurality of wires has a largest number of correctable errors, and comparing the largest number of correctable errors associated with the wire to a total number of correctable errors associated with the plurality of wires; and
a computer readable non-transitory medium bearing the program code.

* * * * *